United States Patent [19]
Colinge

[11] Patent Number: 5,233,236
[45] Date of Patent: Aug. 3, 1993

[54] METHOD AND DEVICE FOR COMPENSATING DRIFT IN A SEMICONDUCTOR ELEMENT

[75] Inventor: Jean P. Colinge, Louvain-la-Neuve, Belgium

[73] Assignee: Interuniversitair Micro Eleckronica Centrum VZW, Belgium

[21] Appl. No.: 720,473

[22] PCT Filed: Oct. 26, 1990

[86] PCT No.: PCT/EP90/01811
§ 371 Date: Jun. 25, 1991
§ 102(e) Date: Jun. 25, 1991

[87] PCT Pub. No.: WO91/06979
PCT Pub. Date: May 16, 1991

[30] Foreign Application Priority Data
Oct. 26, 1989 [NL] Netherlands .......... 8902662

[51] Int. Cl.⁵ .............................. H03K 3/01
[52] U.S. Cl. ................... 307/308; 307/296.6
[58] Field of Search .......... 307/310, 309, 308, 491, 307/296.6

[56] References Cited
U.S. PATENT DOCUMENTS
3,609,414  9/1971  Pleshko .................. 307/310

Primary Examiner—Jin F. Ng
Assistant Examiner—Sinh Tran
Attorney, Agent, or Firm—Obtrolenk, Faber, Gerb & Soffen

[57] ABSTRACT

Parameter drift occurring in the threshold voltage of a semiconductor is compensated for through feedback control which feeds back a voltage which depends upon the amount of radiation impinging on the semiconductor element. Specifically, the semiconductor element contains a region of insulating material and a region of semiconductor material. A sensor is provided for sensing the amount of radiation impinging on the semiconductor element and for developing a feedback voltage signal which is transmitted to a region of the semiconductor adjoining the insulating region.

4 Claims, 2 Drawing Sheets

METHOD AND DEVICE FOR COMPENSATING DRIFT IN A SEMICONDUCTOR ELEMENT

Semiconductor elements, particularly SOI circuits (Silicon on Insulator), are very useful for applications in environments wherein radiation dosages can fall on the semiconductor element. SOI elements in particular are insensitive to short radiation pulses and transient photocurrents because they contain small amounts of silicon. A film of silicon oxide is usually kept as thin as possible so that when it is radiated as little charge carrier as possible is created in the oxide. Semiconductor elements are usually provided with a feedback voltage in order to obtain a suitable operating or threshold voltage of the semiconductor element even in the case of induced charge carriers.

CMOS-SOI technology in particular is being applied more and more for manufacture of circuits wherein high speed is important, such as in oscillators and the like.

With respect to the so-called SIMOX technique wherein oxygen is implanted in silicon, a silicon layer of for instance 100 nm thickness can be obtained.

By making the feedback dependent on the sensed amount of radiation the threshold voltage remains relatively constant at a radiation value of 50-100 krad, which is highly advantageous for instance in space travel.

Further advantages, features and details will become apparent with reference to the drawings, wherein.

Figure 1:
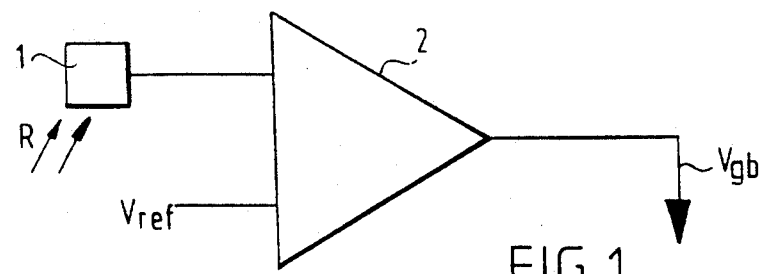
FIG. 1 shows a block diagram of a first preferred embodiment according to the present invention.

In FIG. 1 a voltage emanating from a sensor 1 is compared in a differential amplifier 2 to a reference voltage $V_{ref}$ and a voltage $V_{gb}$ is subsequently fed back to the part of the semiconductor element for which drift has to be compensated.

Figure 2:
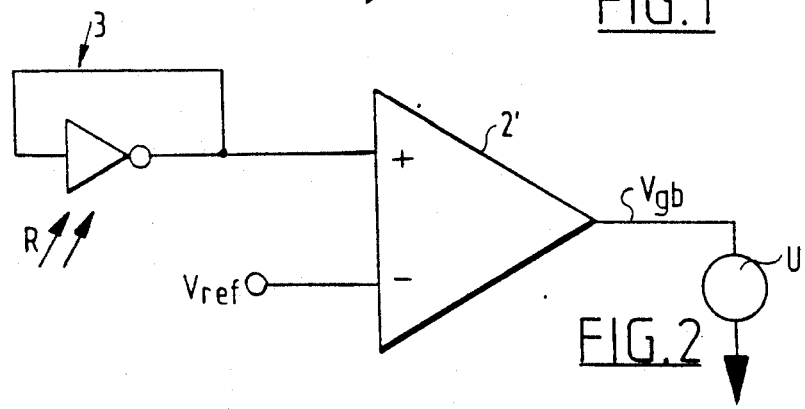
FIG. 2 is a block diagram of a second preferred embodiment according to the present invention.

A block diagram in FIG. 2 makes use as radiation-sensitive element onto which radiation R falls of an inverter 3 in SOI (preferably SIMOX) technology, the output of which is compared in a differential amplifier 2' to a reference voltage $V_{ref}$ whereafter the feedback voltage $V_{gb}$ is fed back to the backgate of an SOI transistor via a voltage source U of for example minus 10 volts.

Figure 3:
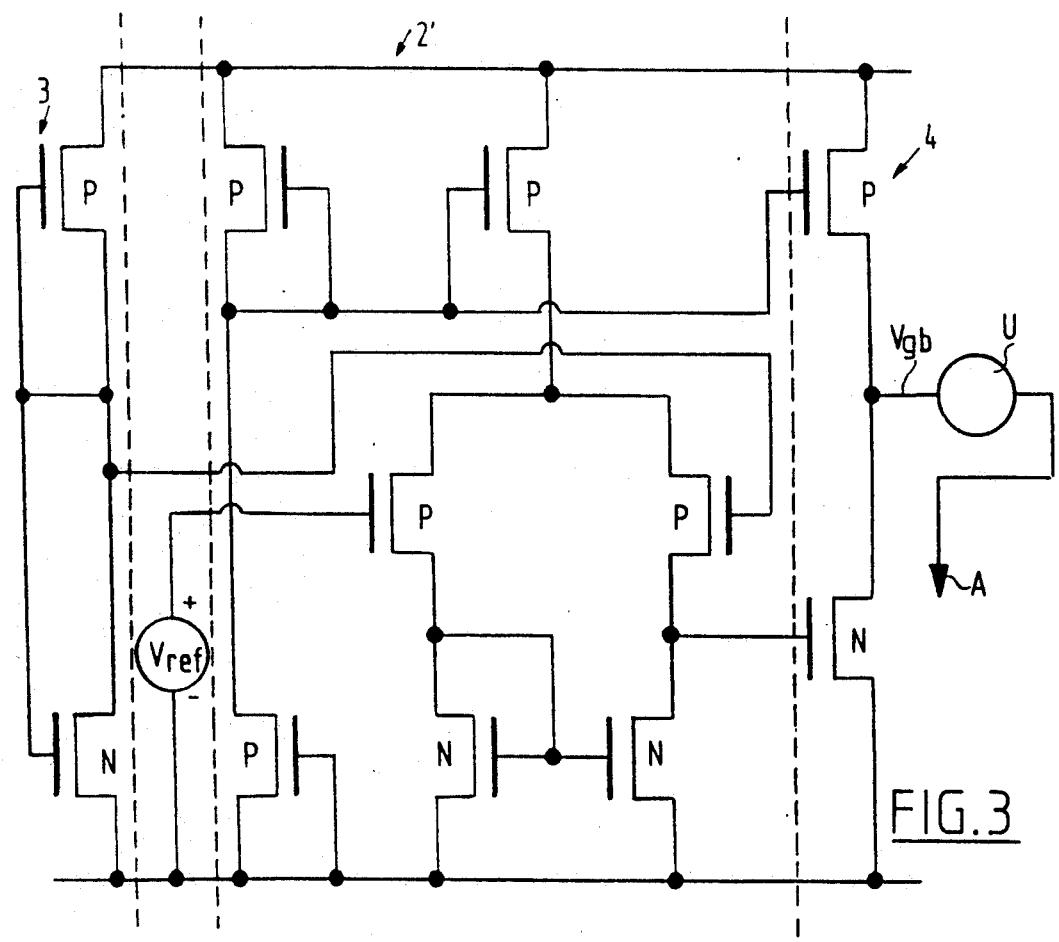
FIG. 3 is a circuit diagram of the preferred embodiment of FIG. 2.

FIG. 3 shows a circuit diagram as a preferred embodiment of the block diagram of FIG. 2, wherein the sensor 1 is formed by an N- and P-channel FET and the differential amplifier 2' is likewise formed by a number of P- and N-channel FETs. Via a buffer circuit 4 also consisting of P- and N-channel FETs and the voltage source U the voltage $V_{fb}$ is fed back to the backgate as indicated schematically with the arrow A.

The semiconductor element according to the present invention can be integrated in simple manner during manufacture of a CMOS circuit; it is however also possible to employ a separate circuit for the feedback.

Simulations using a computer have shown that the threshold voltage $V_t$ of a SOI transistor with both a P-channel and an N-channel FET is stabilized to a considerable extent.

Figure 4:
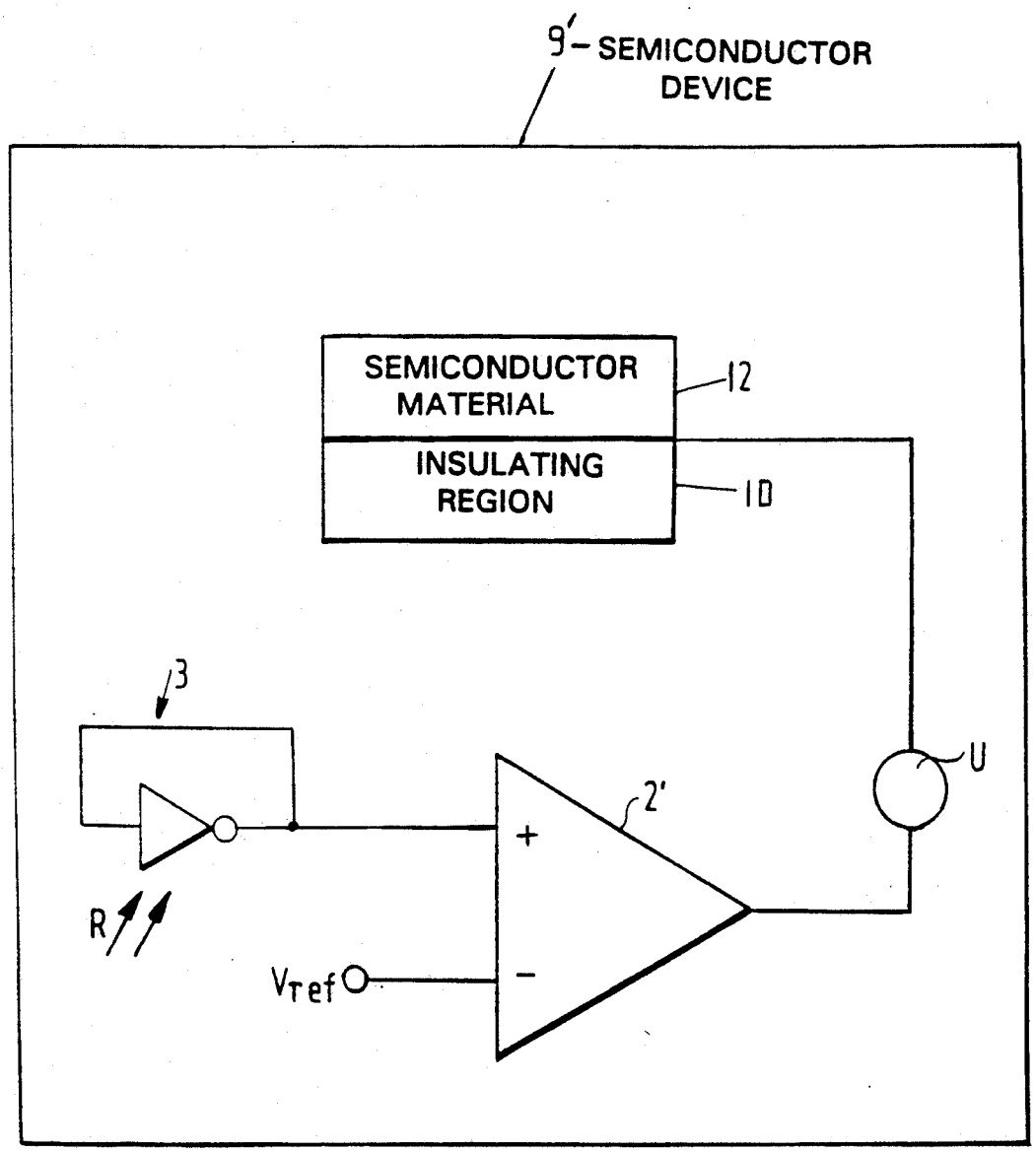
FIG. 4 is a block diagram, similar to FIG. 2, which shows the point of application of a feedback voltage.

In accordance with the present invention and with reference to FIG. 4, the present invention is directed to a method for compensating for drift occurring in the threshold voltage of a semiconductor element of an integrated semiconductor device 9', in a predetermined region of the semiconductor material thereof. The semiconductor element has a region containing insulating material 10 and a region containing semiconductor material 12. A feedback voltage $V_{gb}$ is applied via the voltage source U to a backgate region 13 of the semiconductor material which adjoins the insulating region, depending on the amount of detected radiation in the inverter 3.

I claim:

1. Semiconductor element comprising an SOI circuit including a first region of semiconductor material and a second region of insulating material, and including a third region adjoining said first region of semiconductor material and said second region of insulating material, a sensor for sensing the amount of radiation falling on the semiconductor element, feedback voltage means coupled to said sensor for developing a feedback voltage, and means for feeding back said feedback voltage to said third region, wherein a voltage value of said feedback voltage is dependent on the amount of radiation sensed by the sensor, and wherein said semiconductor element is fabricated in SIMOX technology, and wherein the sensor comprises an inverter.

2. Semiconductor element as claimed in claim 1, wherein the sensor is integrated with the semiconductor element.

3. Semiconductor element as claimed in claim 1, said inverter being a CMOS inverter and said feedback voltage means being an integrated operational amplifier having an output which is coupled to said means for feeding back said feedback voltage to said third region.

4. A compensating method for a semiconductor element, comprising the steps of:
providing a semiconductor element including a first region of semiconductor material, a second region of insulating material, and a third region of semiconductor material adjoining said first region of semiconductor material and said second region, said semiconductor element being fabricated in SIMOX technology;
sensing the amount of radiation falling on said semiconductor element with a sensor comprising an inverter;
developing a feedback voltage which is dependent upon said radiation falling on said semiconductor element; and
feeding said feedback voltage to said third region for compensating for drifts occurring in a threshold voltage associated with said first region of semiconductor material.

* * * * *